(12) United States Patent
Kim et al.

(10) Patent No.: US 9,818,491 B2
(45) Date of Patent: Nov. 14, 2017

(54) MEMORY DEVICE AND OPERATING METHOD THEREOF

(71) Applicant: SK hynix Inc., Gyeonggi-do (KR)

(72) Inventors: Jong-Sam Kim, Gyeonggi-do (KR); Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/059,107

(22) Filed: Mar. 2, 2016

(65) Prior Publication Data

US 2017/0110200 A1 Apr. 20, 2017

(30) Foreign Application Priority Data

Oct. 15, 2015 (KR) .................. 10-2015-0143923

(51) Int. Cl.

| G11C 17/00 | (2006.01) |
|---|---|
| G11C 17/18 | (2006.01) |
| G11C 17/16 | (2006.01) |
| G11C 29/04 | (2006.01) |
| G11C 11/406 | (2006.01) |
| G11C 29/50 | (2006.01) |
| G11C 29/44 | (2006.01) |

(52) U.S. Cl.
CPC ............ *G11C 17/18* (2013.01); *G11C 11/406* (2013.01); *G11C 17/16* (2013.01); *G11C 29/04* (2013.01); *G11C 29/50016* (2013.01); *G11C 2029/4402* (2013.01); *G11C 2211/4068* (2013.01)

(58) Field of Classification Search
CPC .......... G11C 17/18; G11C 29/04; G11C 17/16
See application file for complete search history.

(56) References Cited

U.S. PATENT DOCUMENTS

| 8,630,141 B2 | 1/2014 | Tamlyn |
|---|---|---|
| 2009/0161459 A1* | 6/2009 | Kohler ................. G11C 11/406 365/201 |
| 2014/0241093 A1* | 8/2014 | Lee .................... G11C 11/40611 365/222 |

FOREIGN PATENT DOCUMENTS

KR 1020140120638 10/2014

* cited by examiner

*Primary Examiner* — Richard Elms
*Assistant Examiner* — Mohammed A Bashar
(74) *Attorney, Agent, or Firm* — IP & T Group LLP

(57) ABSTRACT

A memory device includes a plurality of memory cells for storing data; a plurality of memory cells for storing data; a non-volatile memory unit; a test control unit suitable for detecting weak memory cells among the plurality of memory cells; a program control unit suitable for controlling addresses of the detected weak memory cells to be programmed in the non-volatile memory unit; and a refresh control unit suitable for refreshing the addresses stored in the non-volatile memory unit more frequently than other memory cells.

14 Claims, 3 Drawing Sheets

MEMORY DEVICE AND OPERATING METHOD THEREOF

CROSS-REFERENCE TO RELATED APPLICATION

The present application claims priority of Korean Patent Application No. 10-2015-0143923, filed on Oct. 15, 2015, which is incorporated herein by reference in its entirety.

TECHNICAL FIELD

Various embodiments of the present invention relate generally to semiconductor technology and, more particularly, to a memory device and an operating method thereof.

BACKGROUND

Memory devices include a plurality of memory cells. A memory cell of a memory device, such as, for example, a memory cell of a DRAM, may include a transistor serving as a switch and a capacitor for storing electrical charges corresponding to data. A logic level of the data stored in a capacitor of a memory cell may be high (logic level 1) or low (logic level 0) depending upon the amount of the electrical charges stored in the capacitor.

Theoretically, while data is stored in the form of electrical charges in a memory cell capacitor, there is no loss of data or power consumption. However, due to a leakage current, the stored electrical charges may be degraded and the corresponding data lost. For example, a leakage current may arise from a PN junction of a metal oxide semiconductor (MOS) transistor. For preventing the degradation of the stored electrical charges and possible data loss, memory cells are typically read and recharged periodically, an operation commonly referred to as a refresh operation.

Typically, a memory controller applies a refresh command to a memory device periodically at a predetermined period which takes into account a data retention time of the memory device. For example, when the data retention time of the memory device is 64 ms, the refresh operation should be repeated for all the memory cells of the memory device at a time period which is less or equal to 64 ms.

If in a test process employed during manufacturing, the data retention time of some memory cells included in the memory device is determined not to reach the predetermined refresh period, the memory device is considered as defective and is discarded. Discarding memory devices having memory cells with insufficient retention times decreases substantially the manufacturing yield of memory devices. Also, data retention times of memory cells may be degraded due to various factors even after manufacturing, so that memory cells may cause errors even though the memory device has passed the test process. Hence, improvements are desirable.

SUMMARY

Various embodiments of the present invention are directed to a memory device that is suitable for performing an improved refresh operation. More specifically, an aspect of the invention relates to a memory device is suitable for performing a refresh operation to memory cells having short retention times. Another aspect of the invention relates to an operating method for a semiconductor device.

Further, various embodiments of the present invention are directed to a memory device that may control addresses of memory cells having short retention times to be programmed easily in an internal non-volatile memory.

In an embodiment, a memory device may include a plurality of memory cells for storing data; a plurality of memory cells for storing data; a non-volatile memory unit; a test control unit suitable for detecting weak memory cells among the plurality of memory cells; a program control unit suitable for controlling addresses of the detected weak memory cells to be programmed in the non-volatile memory unit; and a refresh control unit suitable for refreshing the addresses stored in the non-volatile memory unit more frequently than other memory cells.

In an embodiment, an operating method for a memory device may include detecting weak word lines to which memory cells having data retention times, less than a first reference time and greater than or equal to a second reference time that is less than the first reference time, are coupled; programming addresses of the weak word lines in a non-volatile memory unit; and refreshing the weak word lines more frequently than other word lines using the addresses programmed in the non-volatile memory unit.

DETAILED DESCRIPTION

Figure 1:
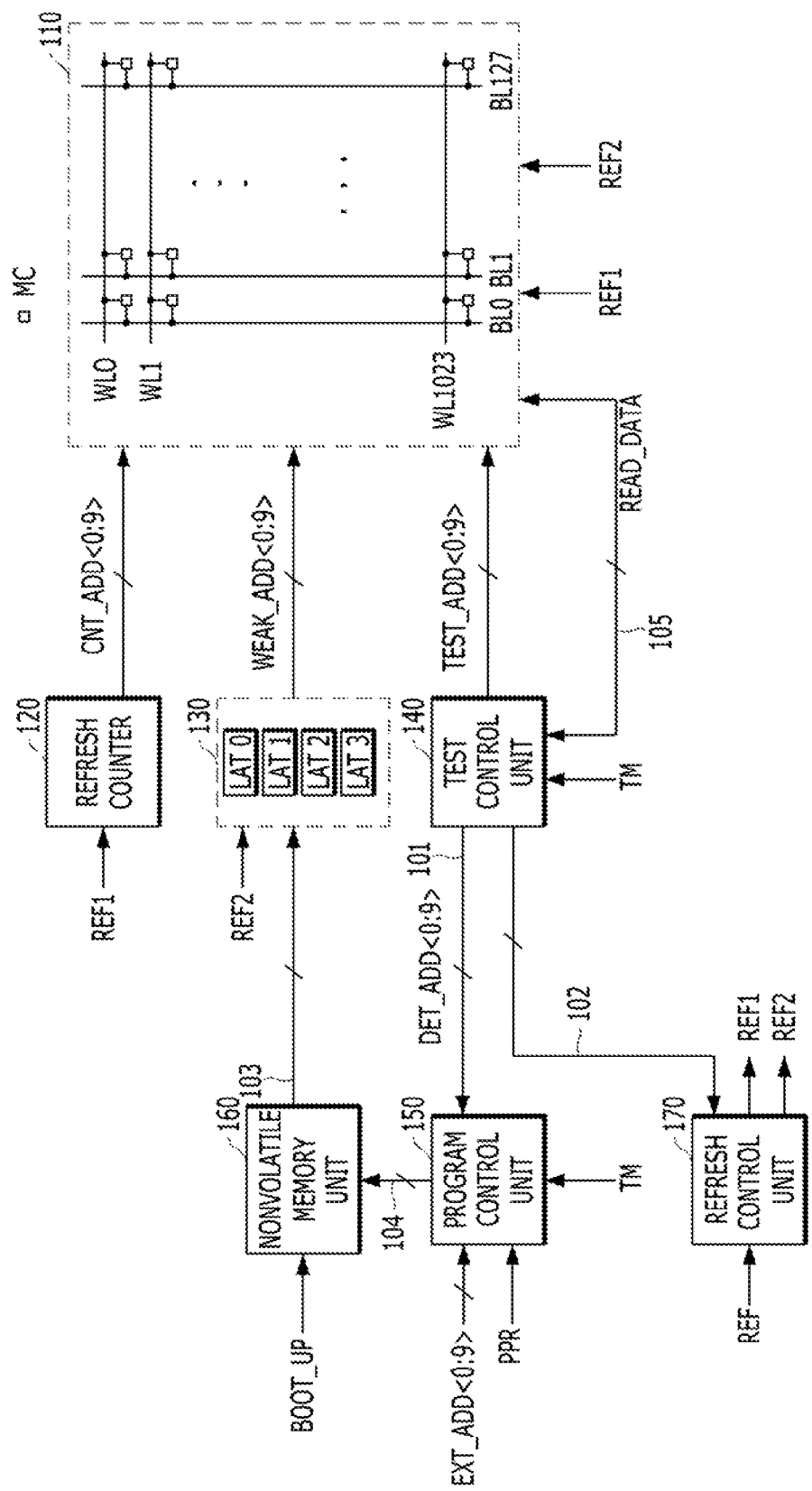
FIG. 1 is a block diagram of a memory device, according to an embodiment of the present invention.

Various embodiments of the invention will be described below more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art.

Throughout the disclosure, like reference numerals refer to like parts throughout the various figures and embodiments of the present invention.

It is also noted that in this specification, "connected/coupled" refers to one component not only directly coupling another component but also indirectly coupling another component through an intermediate component.

In addition, a singular form may include a plural form as long as it is not specifically mentioned otherwise.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be further understood that the terms "comprises", "comprising", "includes", "including," "has," and "having" when used in this specification, specify the presence of the stated features, integers, operations, elements, and/or components, but do not preclude the presence or addition of one or more other features, integers, operations, elements, components, and/or groups thereof.

As used herein, the term "and/or" includes any and all combinations of one or more of the associated listed items.

The terminology used herein is for the purpose of describing particular embodiments only and is not intended to be limiting of the present disclosure. Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present invention will be described in detail with reference to the drawings.

FIG. 1 is a block diagram illustrating a memory device, according to an embodiment of the present invention.

Referring to FIG. 1, the memory device may include a cell array 110, a refresh counter 120, an address latch circuit 130, a test control unit 140, a program control unit 150, a non-volatile memory unit 160 and a refresh control unit 170.

The cell array 110 may include a plurality of word lines WL0 to WL1023, a plurality of bit lines BL0 to BL127 and a plurality of memory cells MCs coupled between the word lines and the bit lines. The numbers of the word lines, the bit lines and the memory cells may vary depending on design.

The refresh counter 120 may generate a counting address CNT_ADD<0:9> by performing a counting operation whenever a first refresh signal REF1 is activated. The refresh counter 120 may increase a value of the counting address CNT_ADD<0:9> by one whenever the first refresh signal REF1 is activated. The increasing of the value of the counting address CNT_ADD<0:9> by one may represent that the counting address CNT_ADD<0:9> is changed to select a $(K+1)^{th}$ word line next time in a case where a $K^{th}$ word line is selected at this time.

The address latch circuit 130 may include a plurality of latch sets LAT0 to LAT3 for storing addresses. The address latch circuit 130 may store the addresses which are transmitted from the test control unit 140 after a test operation is completed. For example, the addresses from the test control unit 140 may be transmitted to the program control unit 150 and programmed in the non-volatile memory unit 160. The nonvolatile memory unit 160 may then transmit the programmed addresses to the address latch unit 130. The address latch circuit 130 may then store the addresses transmitted from the non-volatile memory unit 160 in the latch sets LAT0 to LAT3 sequentially in the order received, during a boot-up operation. The address latch circuit 130 may then output the addresses which are stored in the latch sets LAT0 to LAT3 when a second refresh signal REF2 is activated. The address latch circuit 130 may output addresses stored in the latch sets LAT0 to LAT3 sequentially one after another, for example, in the same order in which the addresses were received. Addresses which are output from the address latch circuit 130 may be referred to as weak addresses WEAK_ADD<0:9> and may be addressed for selecting weak word lines. The weak addresses may be identified during a test operation performed by the test control unit 140 as will be described in detail below.

The test control unit 140 may detect weak memory cells or weak word lines containing weak memory cells included in the cell array 110. The weak memory cells may have data retention times that are less than a first reference time and greater than or equal to a second reference time less than the first reference time. Further, all memory cells coupled to a weak word line data may have retention times that are greater than or equal to the second reference time and less than the first reference time. In an embodiment, the second reference time may be a one half of the first reference time. For example, the first reference time may be 64 ms and the second reference time may be 32 ms. The test control unit 140 may perform the test operation according to a test mode that may be set when a test mode signal TM is activated. The test mode signal TM may be activated from when the test operation starts to when a program operation for detected weak addresses is completed.

The test operation of the test control unit 140 may detect one or more weak word lines as follows. The test operation may include a first operation according to which the test control unit 140 may control the cell array 110 to allow the same data (for example, "0" or "1") to be written to all the memory cells MCs. Hence, after the first operation is completed, data stored in the memory cells of the cell array 110 may be all the same either "0" or "1". A first operation of writing data "1" to all of the memory cells of the memory array 110 will be described below, as an example. The test control unit 140 may generate a test address TEST_ADD<0:9> for selecting a corresponding word line for data read or data write during the test operation.

The test operation may include a second operation wherein the test control unit 140 may control the cell array 110 to be refreshed with a period corresponding to the second reference time. When each word line of the cell array 110 is refreshed with the period corresponding to the second reference time, memory cells) having the data retention time less than the second reference time may lose their own data. Data of memory cells having the data retention time greater than or equal to the second reference time may be retained. In the second operation, the test control unit 140 may control the refresh control unit 170 to allow each word line of the cell array 110 to be refreshed with the period corresponding to the second reference time.

While the cell array 110 is refreshed, the test controller unit 140 may read pieces of data for each word line and may combine the pieces of data through an XOR operation. When the XOR-operated result is "0", it may represent that values of the pieces of read data are all the same. When the XOR-operated result is "1", it may represent that one or more of the values of the pieces of read data are different from other values. Since the possibility that all data written in the word lines are inverted is very low, when the XOR-operated result is "0", the test control unit 140 may detect the word lines as first word lines. When the XOR-operated result is "1" the test control unit 140 may not detect the word lines as the first word lines. The word lines to be read may be selected by the test address TEST_ADD<0:9>.

The test operation may include a third operation wherein the test control unit 140 may control the first word lines to be refreshed with the period corresponding to the reference time. When each word line of the cell array 110 is refreshed with the period corresponding to the first reference time, data of memory cells having the data retention times less than the first reference time is lost, and data of memory cells that the data retention time are greater than or equal to the first reference time may be retained. In the third operation, the test control unit 140 may control the refresh control unit 170 to allow each word line of the cell array 110 to be refreshed with the period corresponding to the first reference time.

While the cell array 110 is refreshed, the test controller unit 140 may read pieces of data for each word line and may combine the pieces of data through an XOR operation. The word lines to be read may be selected by the test address TEST_ADD<0:9>. The test control unit 140 may not detect the first word lines, of which the XOR-operated result is "0", as the weak word line, and the test controller unit 140 may detect the first word lines of which the XOR-operated result is "1", as the weak word lines. The test control unit 140 may store the address of the weak word lines until the test is completed.

The test control unit 140 may transmit the one or more detected weak word lines to the program control unit 150 after the test operation is completed. The detected weak word lines may be one or more. When the detected weak word lines are two or more the test control unit 140 may transmit the weak addresses to the program control unit 150 sequentially, for example in the detected order. In a variation, when the detected weak lines are two or more the test control unit 140 may transmit the weak addresses to the program control unit 150 simultaneously. The test control unit 140 may control the program control unit 150 to allow the addresses of the detected weak word lines to be programmed in the non-volatile memory unit 160 after the test operation is completed.

One or more of signal transmission lines 101 may be employed for transmitting the addresses detected in the test control unit to the program control unit 150 and for transmitting signals for controlling the program control unit 150 to allow the addresses stored therein to be programmed in the non-volatile memory 160.

Likewise, one or more, preferably a plurality of signal transmission lines 102 may be employed for transmitting signals for controlling the refresh control unit 170 to refresh each word line with the period corresponding to the second reference time in the second operation and to refresh each word line in the period corresponding to the first reference time in the third operation.

The program control unit 150 may store detection addresses DET_ADD<0:9> which are transmitted from the address latch circuit 120 or external addresses EXT_ADD<0:9> which are received from an external device. The program control unit 150 may control the stored addresses to be programmed in the non-volatile memory unit 160. When the detection addresses DET_ADD<0:9> or the external addresses EXT_ADD<0:9> are two or more, the program control unit 150 may control the addresses to be programmed in the non-volatile memory unit 160 sequentially according to a specified order. Alternatively, when the detection addresses DET_ADD<0:9> or the external addresses EXT_ADD<0:9> are two or more, the program control unit 150 may control the addresses to be programmed in the non-volatile memory unit 160 simultaneously. When the test mode signal TM is activated, the program control unit 150 may store the detection addresses DET_ADD<0:9> and control the detection addresses DET_ADD<0:9> to be programmed in the non-volatile memory unit 160. When a signal PPR for controlling a post package repair operation is activated, the program control unit 150 may store the external addresses EXT_ADD<0:9> and may control the external addresses EXT_ADD<0:9> to be programmed in the non-volatile memory unit 160.

The non-volatile memory unit 160 may store the addresses of the weak word lines which are detected by the test control unit 140. The non-volatile memory may be any one of an E-fuse array circuit, a NAND flash memory, a NOR flash memory, a Magnetic Random Access Memory (MRAM), a Spin Transfer magnetic Random Access Memory (STT-MRAM), a Resistive Random Access Memory (ReRAM), a Phase Change Random Access Memory (PC RAM) and the like.

When a boot-up signal BOOT_UP is activated, the non-volatile memory unit 160 may transmit the stored addresses of the weak word lines to the address latch circuit 120. When the stored addresses of the weak word lines is two or more, the non-volatile memory unit 160 may transmit the addresses to the address latch circuit 120 sequentially in a specified order, for example, in the order detected or stored. One or more, preferably a plurality of signal transmission lines 103 may be employed for transmitting the stored addresses of the weak word lines in the non-volatile memory 160 to the address latch circuit 120. Also one or more, preferably a plurality of signal transmission lines may be employed for transmitting a plurality of control signals for controlling the program operation of the non-volatile memory unit 160 in the program control unit 150. Further one or more, preferably a plurality of signal transmission lines 105 may be employed for transmitting signals between the test control unit 140 and the cell array 110. A signal for controlling the cell array 110 to perform the test operation through the transmission lines 105, and data read READ_DATA from the cell array 110 may be transmitted to the test control unit 140 through the transmission lines 105.

The refresh control unit 170 may activate the first refresh signal REF1 when a refresh signal REF is activated in response to a refresh command. When the refresh signal REF is activated at a predetermined number of times, that is, once or more, the refresh control unit 170 may activate the second refresh signal REF2. When the second operation is performed by the test control unit 140, the refresh control unit 170 may activate the first refresh signal REF1 in an interval in which each word line may be refreshed in units of the second reference time. When the third operation is performed by the test control unit 140, the refresh control unit 170 may activate the REF1 in an interval in which each word line may be refreshed in units of the first reference time.

When the first refresh signal REF1 is activated in the cell array 110, the word lines corresponding to the counting address CNT_ADD<0:9> may be refreshed. When the second refresh signal REF2 is activated, the word lines corresponding to the weak addresses WEAK_ADD<0:9> may be refreshed.

When the memory device performs a test operation, all the memory cells MCs in the cell array 110 may be written a "1" when a test mode is set. Then, each word line may be refreshed in the period corresponding to the second reference time. The word lines with one or more memory cells coupled thereto having data which is not retained, may not be detected as the first word ivies. The word lines, with all their memory cells coupled thereto having data which is retained, may be detected as the first word lines.

After detecting of the first word lines is completed, each word line is refreshed in the period corresponding to the first reference time. The first word lines with one or more memory cells coupled thereto having data which is not retained may be detected as weak word lines. The word lines with all their memory cells coupled thereto having data which is retained, may not be detected as the weak word lines.

The detected weak word lines may be stored in the test control unit 140 until the test is completed, and may be transmitted to the address latch circuit 120 to be stored therein. The addresses stored in the address latch circuit 120 may be programmed in the non-volatile memory unit 160 under control of the test control unit 140 and the program control unit 150.

In a boot-up operation of the memory device, the addresses stored in the non-volatile memory unit 160 may be transmitted to the address latch circuit 120 to be stored therein. In a normal operation, the memory device may perform sequentially a first refresh on the word lines. For the refresh period in which the word lines are first-refreshed once, the memory device may perform a second refresh on word lines (that is, weak word lines) corresponding to the addresses stored in the address latch circuit 120 once. Therefore, for the refresh period, since the weak word lines are refreshed two times or more and other word lines are refreshed once, the weak word lines may be refreshed more frequently than other word lines.

Figure 2:
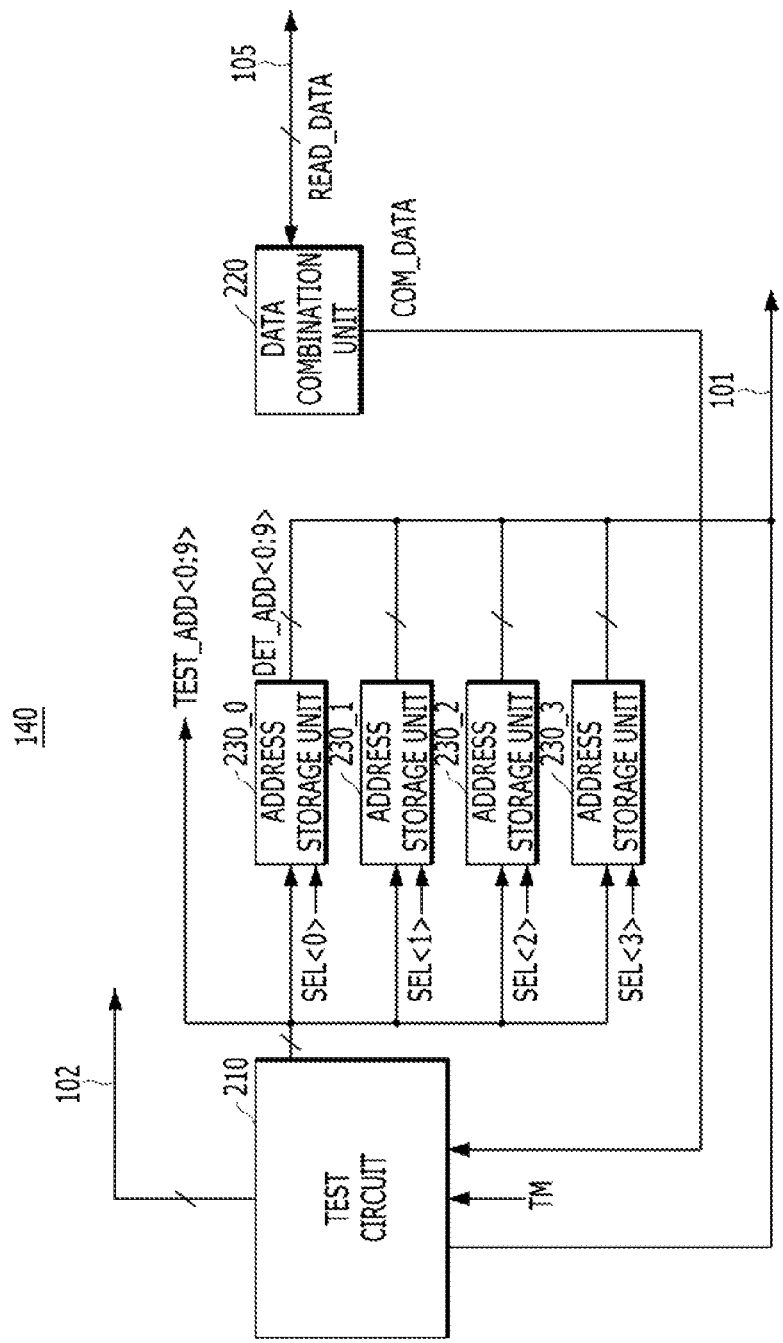
FIG. 2 is a detailed diagram of an example of a test control unit of the memory device of FIG. 1.

FIG. 2 is a detailed diagram of the test controller unit 140 shown in FIG. 1.

Referring to FIG. 2 the test controller unit 140 may include a test circuit 210, a data combination unit 220 and a plurality of addresses storage units 230_0 to 230_3.

The test circuit 210 may be a circuit for generating various control signals required to perform a test operation. The test circuit 210 may be activated or deactivated in response to a test mode signal TM. When the test draft 210 is activated the test circuit 210 may generate the control signal and the test circuit 210 may perform various controls.

The data combination unit 220 may generate operated data COM_DATA through an XOR operation (i.e., an XOR combination) on data read from each word line in the second and third operations. The test circuit 210 may detect the weak word lines according to a value of operated data COM_DATA. When the weak word lines are detected, the test circuit 210 may allow a test address TEST_ADD<0:9> corresponding to the weak word lines to be stored in the addresses storage units 230_0 to 230_3.

The addresses storage units 230_0 to 230_3 may store the test address TEST_ADD<0:9> corresponding to the weak word lines detected during the test operation. The address storage units 230_0 to 230_3 may be selected in response to a selection signal SEL<0:3> corresponding thereto. When the addresses storage units 230_0 to 230_3 are selected the addresses storage units 230_0 to 230_3 may store the test address TEST_ADD<0:9> or may output the stored addresses.

Figure 3:
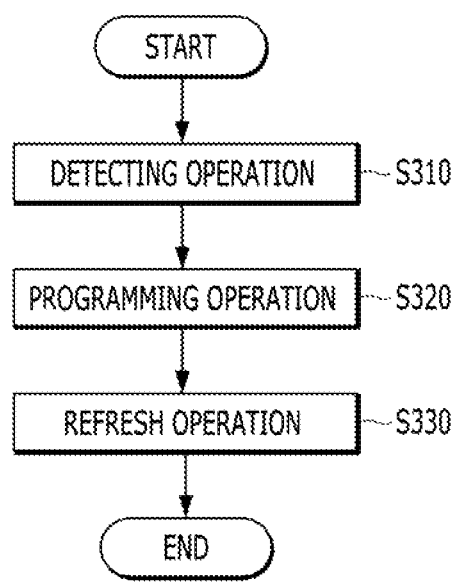
FIG. 3 is a flowchart of an operation of the memory device of FIG. 1.

FIG. 3 is a flowchart of an operation of the memory device shown in FIG. 1.

Referring to FIG. 3, the operation of the memory device may include a detecting operation S310, a programming operation S320 and refresh operation S330.

In the detecting operation S310, weak word lines may be detected. The weak word lines may be detected based on whether or not memory cells coupled thereto meet a predetermined condition of data retention times. For example, the word lines where the data retention times of all the memory cells coupled thereto are greater than or equal to the second reference time and the data retention times of one or more memory cells of the memory cells coupled thereto are less than a first reference time may be detected as the weak word lines.

In the programming operation S320, addresses of the weak word lines detected in the detecting operation S310 may be programmed in the non-volatile memory unit 160. The non-volatile memory unit 160 may include an E-fuse array. The addresses of the weak word lines stored in the non-volatile memory unit 160 may be retained regardless of the power supply of the memory device.

In the refresh operation S330, the weak word lines may be refreshed more frequently than other word lines based on the addresses stored in the non-volatile memory unit 60. Furthermore, in the refresh operation S330, the word lines WL0 to WL1023 included in the cell array 110 are sequentially first-refreshed once for the refresh period, and the weak word lines may be second-refreshed once or more for the refresh period.

Figure 4:
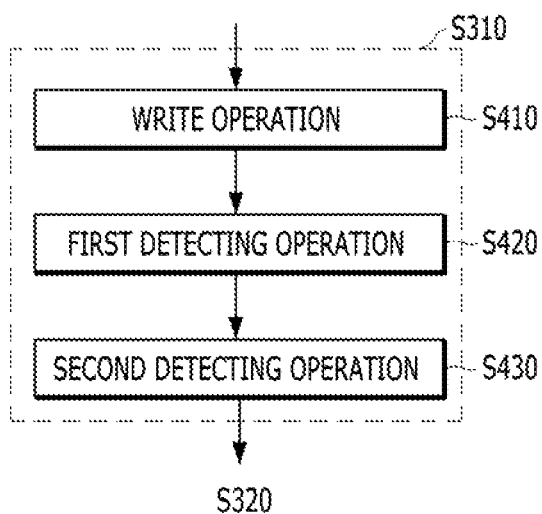
FIG. 4 is a detailed flowchart of an example of a detecting step of the operation of FIG. 3.

FIG. 4 is a detailed flowchart for describing the detecting operation S310 of FIG. 3.

Referring to FIG. 4, the detecting operation S310 may include a write operation S410, a first detecting operation S420 and a second detecting operation S430.

In the write operation S410, the same data may be written to all the memory cells MCs included in the cell array 110. For example, "1" may be written to all the memory cells MCs in the cell array 110.

In the first detecting operation S420, the word lines WL0 to WL1023 may be refreshed in the period corresponding to the second reference time. In the first detecting operation S420, word lines, where data retention times of all the memory cells coupled thereto are greater than or equal to the second reference time, may be detected as the first word lines based on the XOR-operated result for data read from each word line.

In the second detecting operation S430, the first word lines detected in the first detecting operation S420 may be refreshed in the period corresponding to the first reference time. Also the first word lines where the data retention times of one or more memory cells of the memory cells coupled thereto are less than the first reference time may be detected as the weak word lines based on the XOR-operated result for data read from the first word lines.

The memory device and the operating method of the memory device according to embodiments of the present invention may enable detection of repairable weak word lines by increasing a refresh frequency without replacing the word lines. The addresses of the detected weak word lines may be programmed in the non-volatile memory unit 160 without any external command of the memory device. Also, operational errors due to the weak word lines may be reduced by increasing the refresh frequency using the addresses of the weak word lines programmed in the non-volatile memory unit 160.

Although various embodiments have been described for illustrative purposes, it will be apparent to those skilled in the relevant art that various changes and modifications may be made without departing from the spirit and scope of the invention as defined in the following claims.

What is claimed is:
1. A memory device comprising:
a plurality of memory cells configured to store data;
a non-volatile memory unit;
a test control unit configured to detect weak memory cells among the plurality of memory cells;

a program control unit configured to control addresses of the detected weak memory cells to be programmed in the non-volatile memory unit; and a refresh control unit configured to refresh the addresses stored in the non-volatile memory unit more frequently than other memory cells, wherein the detected weak memory cells have data retention times less than a first reference time and greater than or equal to a second reference time that is less than the first reference time, wherein the test control unit controls the data to be written to the plurality of memory cells, controls the plurality of memory cells to be refreshed with a period corresponding to the second reference time, detects one or more first memory cells having the data retention times greater than or equal to the second reference time based on an XOR operated result for data read from the plurality of memory cells, controls the one or more first memory cells to be refreshed with a period corresponding to the first reference time, and detects the weak memory cells based on an exclusive OR operation result for data read from the one or more first memory cells.

2. The memory device of claim 1, wherein the program control unit stores the addresses of the weak memory cells detected from the test control unit until detection of the weak memory cells is completed, and after the detection of the weak memory cells is completed, the program control unit controls the stored addresses to be programmed sequentially in the non-volatile memory unit.

3. The memory device of claim 1, wherein the non-volatile memory unit comprises an E-fuse array.

4. The memory device of claim 1, wherein the refresh control unit controls the plurality of memory cells corresponding to the addresses stored in the non-volatile memory unit to be second-refreshed once or more in a refresh period in which the plurality of memory cells are first-refreshed.

5. The memory device of claim 1, further comprising:
a plurality of word lines, each coupled to one or more memory cells, and
the test control unit detects weak word lines of the plurality of word lines, to which the weak memory cells are coupled.

6. The memory device of claim 5, wherein the test control unit detects one or more test target word lines among the plurality of word lines where the data retention times of all memory cells coupled thereto are greater than or equal to the second reference time, and detects the weak word lines of the one or more test target word lines.

7. The memory device of claim 6, wherein the program control unit controls the addresses of the weak word lines to be programmed in the non-volatile memory unit.

8. The memory device of claim 6, wherein the test control unit controls the data to be written to all the plurality of memory cells, controls the word lines to be refreshed with a period corresponding to the second reference time, detects one or more test target word lines where the data retention times of all memory cells coupled thereto are greater than or equal to the second reference time based on an XOR-operated result for data read from the word lines, controls the one or more test target word lines to be refreshed with a period corresponding to the first reference time, and detects the weak word lines based on an XOR-operated result for data read from the test target word lines.

9. The memory device of claim 8, wherein the test control unit detects word lines where the exclusive OR operation result for data read from the word lines is a first value as first memory cells when the test target word lines are detected, and detects word lines where the exclusive OR operation result for data read from the test target word lines is a second value as the weak word lines when the weak word lines are detected.

10. The memory device of claim 5, wherein the program control unit stores the addresses of the weak memory cells detected from the test control unit until detection of the weak word lines is completed, and after the detection of the weak word line is completed, the program control unit controls the stored addresses to be sequentially programmed in the non-volatile memory unit.

11. The memory device of claim 5, wherein the refresh control unit controls the weak word lines corresponding to the addresses stored in the non-volatile memory unit to be second-refreshed once or more in a refresh period in which the word lines are first-refreshed.

12. An operating method of a memory device, the method comprising:
detecting weak word lines to which memory cells having data retention times, less than a first reference time and greater than or equal to a second reference time that is less than the first reference time, are coupled;
programming addresses of the weak word lines in a non-volatile memory unit; and
refreshing the weak word lines more frequently than other word lines using the addresses programmed in the non-volatile memory unit,
wherein the detecting the weak word line comprises:
writing the data to memory cells coupled to the word lines;
refreshing the word lines with a period corresponding to the second reference time;
detecting one or more test target word lines according to an XOR operated result for data read from the memory cells of the word lines;
refreshing the one or more test target word lines with a period corresponding to the first reference time; and
detecting weak word lines according to an XOR operated result for data read from memory cells of the one or more test target word lines.

13. The operating method of claim 12, wherein the detecting the test target word lines comprises:
detecting word lines where the exclusive OR operation result for the data read is a first value as the test target word lines when the test target word lines are detected, and
detecting the test target word lines where the exclusive OR operation result for the data read is a second value as the weak word lines when the weak lines are detected.

14. The operating method of claim 12, wherein the refreshing comprises controlling the word lines corresponding to the addresses stored in the non-volatile memory unit to be second-refreshed once or more in a refresh period in which the memory devices are first-refreshed.

* * * * *